US011662383B2

(12) United States Patent
Sinha et al.

(10) Patent No.: US 11,662,383 B2
(45) Date of Patent: May 30, 2023

(54) HIGH-SPEED FUNCTIONAL PROTOCOL BASED TEST AND DEBUG

(71) Applicant: Synopsys, Inc., Mountain View, CA (US)

(72) Inventors: Anubhav Sinha, Hyderabad (IN); Brian Archer, Mountain View, CA (US); Abhijeet Samudra, Santa Clara, CA (US); Kranthi Kandula, Hyderabad (IN); Amit Kapatkar, Hyderabad (IN); Akshay Kumar Gupta, Sunnyvale, CA (US); Hemasagar Babu Reddy, Sunnyvale, CA (US); Ajay Nagarandal, Dublin, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/450,888

(22) Filed: Oct. 14, 2021

(65) Prior Publication Data

US 2022/0120811 A1    Apr. 21, 2022

Related U.S. Application Data

(60) Provisional application No. 63/092,858, filed on Oct. 16, 2020.

(51) Int. Cl.
*G01R 31/00*     (2006.01)
*G01R 31/3183*   (2006.01)
*G06F 30/392*    (2020.01)

(52) U.S. Cl.
CPC .... *G01R 31/318314* (2013.01); *G06F 30/392* (2020.01)

(58) Field of Classification Search
CPC ...... G01R 31/318314; G01R 31/31813; G01R 31/3183; G01R 31/31724; G01R 31/31723; G01R 31/31717; G06F 39/392; G06F 30/392; G06F 30/39
See application file for complete search history.

(56) References Cited

U.S. PATENT DOCUMENTS

| | | | |
|---|---|---|---|
| 2001/0034866 A1* | 10/2001 | Barry | G01R 31/31813 714/734 |
| 2011/0244814 A1* | 10/2011 | Andreu | G01R 31/31903 455/90.1 |
| 2013/0124934 A1 | 5/2013 | Jones et al. | |
| 2015/0067426 A1 | 3/2015 | Nardini et al. | |
| 2019/0033375 A1 | 1/2019 | Carrieri et al. | |
| 2020/0124667 A1 | 4/2020 | Whetsel | |
| 2020/0363470 A1* | 11/2020 | Sonawane | G01R 31/318566 |

OTHER PUBLICATIONS

International Search Report and Written Opinion Applicaiton No. PCT/US2021/055069 dated Jan. 28, 2022.

* cited by examiner

*Primary Examiner* — Christine T. Tu
(74) *Attorney, Agent, or Firm* — Patterson + Sheridan, LLP

(57) ABSTRACT

An integrated circuit (IC) device and a method for communicating test data utilizes test control circuitry, and a test controller. The test controller is coupled with the test control circuitry and decodes packetized test pattern data to identify configuration data for the test controller and test data for the test control circuitry. The test controller further communicates the test data to the test control circuitry, and packetizes resulting data received from the test control circuitry. The resulting data corresponds to errors identified by a test performed based on the test pattern data.

14 Claims, 11 Drawing Sheets

HIGH-SPEED FUNCTIONAL PROTOCOL BASED TEST AND DEBUG

RELATED APPLICATION

This application claims the benefit of U.S. provisional patent application Ser. No. 63/092,858, filed Oct. 16, 2020, which is hereby incorporated herein by reference.

TECHNICAL FIELD

The present disclosure relates to testing and debugging integrated circuit chips, and, in more particular, testing and debugging integrated circuit chips via a high-speed communication interface.

BACKGROUND

As the circuit size (e.g., number of circuit components and devices) of integrated circuit (IC) devices increases, the test and debug data requirements increase accordingly. Further, as the circuit size of the IC devices increases, the complexity of the ICs also increases. Accordingly, to support testing the connections and circuit elements of the IC devices, the amount of test data (e.g., boundary scan data and scan data) is increased. In many current implementations, the test data is communicated to an IC device via general purpose input/output (GPIO) pins. In such implementations, the data rate used to communicate corresponds to the data rate of the GPIO pins. Accordingly, as the GPIO pins have a low data rate (e.g., less than 1 Megabit per second (Mbps)) and as the size of the test data increases, the testing time of an IC device increases. Increasing the testing time of an IC device results in a reduced number of IC devices being tested over a given period, increasing the manufacturing cost of the IC devices.

SUMMARY

In one example, an integrated circuit (IC) device includes test control circuitry, and a test controller. The test controller is coupled with the test control circuitry and decodes packetized test pattern data to identify configuration data for the test controller and test data for the test control circuitry. The test controller further communicates the test data to the test control circuitry, and packetizes resulting data received from the test control circuitry. The resulting data corresponds to errors identified by a test performed based on the test pattern data.

In one example, a method includes receiving packetized test pattern data from a test device, and decoding the packetized test pattern data to identify configuration data for a test controller and test data. The method further includes communicating the test data to test control circuitry, and packetizing resulting data received from the test control circuitry. The resulting data corresponds to errors identified by a test performed within the IC device based on the test data. Further, the method includes outputting the packetized resulting data from the IC device to the test device.

In one example, a test controller of an IC device includes interconnect bridge circuitry that receives packetized test pattern data. The test controller further includes test bridge circuitry that decodes the packetized test pattern data to identify configuration data and test data for test control circuitry of the IC device, and communicates the test data to the test control circuitry. Further, the test controller packetizes resulting data received from the test control circuitry. The resulting data corresponds to errors identified by a test performed based on the test pattern data.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
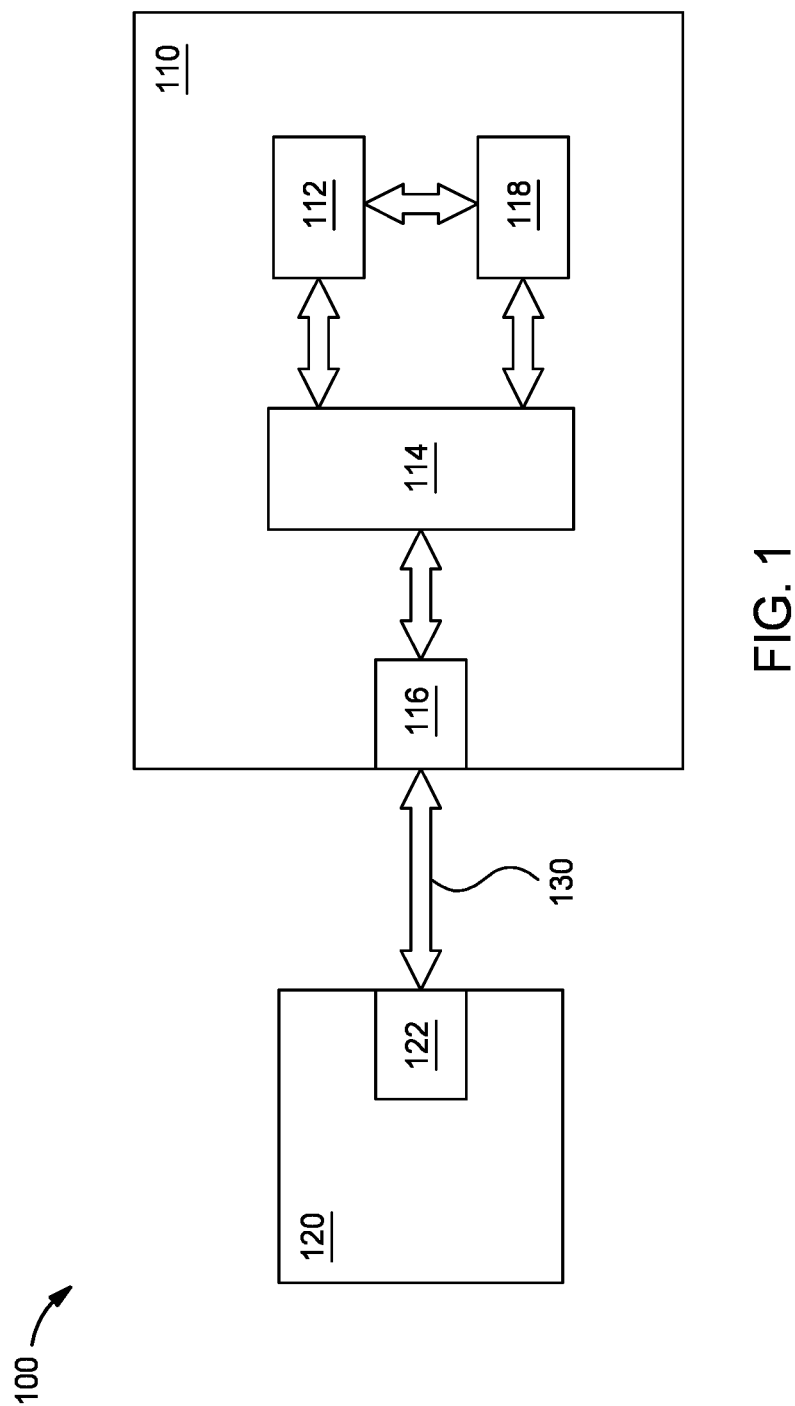
FIG. 1 illustrates a block diagram of a testing system, according to one or more examples.

Aspects of the present disclosure relate to high-speed functional protocol based test and debug.

Integrated circuit (IC) device testing methods that utilize a functional high-speed interface (e.g., a serial high speed interface, among others) reduce the corresponding test application time and/or reduce pin counts utilized during testing. Accordingly, an increased number of ICs may be tested in a given period time. Further, an increased number of ICs may be tested in parallel. Decreasing the amount of test time of an IC device and increasing the number of IC devices that may be tested in a given time periods, decreases the manufacturing costs of the IC devices.

In various examples, a functional high-speed interface provides access to a design for testing (DFT) infrastructure at the system level after manufacturing an IC device and the IC device has been integrated within an electronic system. In various examples, a common pattern format of the test data may be utilized across various stages of an IC. For example, a common pattern format of the test data may be utilized with automatic test equipment (ATE), system level test, and in-field testing for diagnosis.

In the following, a test controller that is able to utilize a serial high speed functional interface is described. Using such a test controller, the number of pins utilized during test and the amount of time utilized during test is reduced. In one or more examples, the test controller operates with high-speed peripherals, such as peripheral component interconnect express (PCIe), universal serial bus (USB), or a Mobile Industry Processor Interface (MIPI), among others. Further, the test controller may include interconnect hardware compatible with a functional peripheral via a high speed bus protocol. In various examples, the test controller operates with scan test data and/or boundary scan test data. Further, the test data pattern format is usable with ATE, a system level test (SLT), and in-field testing and the same test data pattern format may be used across various stages of IC test As will be described in more detail in the following, to test an IC device, a test device converts test data from traditional formats to high speed communication format. Further, the resulting data output by an IC device is converted into a format readable by DFT tools to diagnose failures within the IC device. Utilizing a test controller that communicates via a high-speed communication interface provides a way to access DFT infrastructure within an IC device through high speed inputs and outputs (IOs). In such examples, DFT structures like scan, scan-compression, scan-dump, logic built-in self-test (LBIST), memory built-in self-test (MBIST), boundary scan test, input/output built in self-test (IO-BIST), among others, can be accessed through high speed peripherals. Using the high speed interfaces mitigates the number of IOs used for DFT. Accordingly, scan-data may be driven at a faster rate and/or with a high bandwidth as compared to using general purpose input/output (GPIO) pins. Utilizing a high speed interface reduces test application time and test pin counts, resulting in reduced electronic complexity for the test equipment (e.g., a test device). Further, by using a functional high-speed interface, DFT infrastructure is accessible at the system level even after the IC device has been implemented within a system.

In one or more examples, test data patterns are communicated to an IC device and resulting data is communicated from the IC device application using high-speed functional interfaces. Accordingly, the testing time of IC devices is decreased, increasing the number IC devices that may be tested within a given period of time, decreasing the manufacturing costs of the IC devices.

FIG. 1 illustrates a testing system 100, according to one or more examples. The testing system 100 includes an IC device 110 and a test device 120. The IC device 110 may be referred to as a device under test (DUT). In one example, the IC device 110 is a field programmable gate array (FPGA). In other examples, the IC device 110 is an application specific IC (ASIC) or a general purpose controller (e.g., a central possessing unit (CPU) or a graphics processing unit (GPU), among others). The IC device 110 includes test control circuitry 112, a test controller 114, communication device 116, and core logic 118. In one example, the test control circuitry 112 includes test access port (TAP) circuitry and scan chain circuitry. Further, the test control circuitry 112 includes one or more registers (e.g., a test data register (TDR) and/or a boundary scan shift register (BSR), among others). The TDR may be IEEE1149.1, IEEE1500, and/or IEEE1687 compliant. Further, the TDR and scan chains may be referred together as scan-channels and/or scan IOs.

In one example, the test control circuitry 112 communicates test data to and receives resulting data from the core logic 118. The scan chain circuitry of the test control circuitry 112 function as shift registers to provide (e.g., shift) a predetermined (e.g., known) state to the circuit elements (e.g., internal circuits) of the core logic 118 to determine the functionality of the circuit elements of the core logic 118. In one example, each of the scan chains includes a plurality of link scan cells that operate as shift registers when placed in a test mode. Further, the test control circuitry 112 includes TAP circuitry that performs boundary scan tests of the IC device 110. The boundary scan tests interconnects and/or sub-blocks within the IC device 110.

The test controller 114 is electrically coupled with the test control circuitry 112 and the communication device 116. The test controller 114 receives packetized test pattern data from the communication device 116 and decodes the packetized test pattern data to identify configuration data for the test controller 114 and test data for the test control circuitry 112. The test controller 114 outputs the test data to the test control circuitry 112. The configuration of the test controller 114 is altered based on the configuration data.

The communication device 116 is a high speed communication device. For example, the communication device 116 is a universal serial bus (USB) device, a peripheral component interconnect express (PCIe) device, or a mobile industry processor interface (MIPI) device, among others. In one example, the communication device 116 is a high speed communication device that supports a data rate of at least 1 Megabit per second (Mbps). In other examples, the communication device 116 supports a data rate of at least 2 Mbps. In one or more examples, the communication device 116 supports a data rate of at least 100 Mbps, at least 500 Mbps, at least 1 Gigabit per second (Gbps), or at least 10 Gbps.

The communication device 116 is connected to the test device 120 and receives packetized test pattern data from the test device 120. The communication device 116 communicates the received packetized test pattern data to the test controller 114.

The test device 120 generates and communicates packetized test pattern data to the IC device 110 via the communication interface 130. The test controller 114 receives the packetized test pattern data from the communication device 116, processes the packetized test pattern data, and communicates the processed test pattern data to the test control circuitry 112. The test controller 114 receives resulting data from the test control circuitry 112 and communicates the resulting data to the test device 120 via the communication interface 130. The resulting data may be encoded (e.g., packetized) by the test controller 114 before being communicated to the test device 120. In one example, the resulting data is generated based on a boundary scan test performed with the processed test pattern data and/or scan chain test of a core logic 118 performed with the test pattern data. Further, the resulting data includes error data from the test control circuitry 112 and/or the core logic 118.

The test device 120 includes a communication device 122. The communication device 122 is connected to the communication device 116 via the communication interface 130. The communication device 122 is a USB device, PCIe device, or a MIPI device, among others. The communication device 122 is a high speed communication device similar to that of the communication device 122. In one example, the data rate supported by the communication device 122 is similar to the data rate supported by the communication device 116. For example, the communication devices 116 and 122 both support a data rate of at least 1 Mbps, at least 5 Mbps, at least 100 Mbps, or at least 1 Gbps.

The communication interface 130 includes one or more traces (e.g., wires) that connect the communication device 116 with the communication device 122. In one example, the communication interface is a high speed interface that supports data rates at least similar to that of the communication device 116 and the communication device 122.

The test device 120 further includes one or more processing devices (not shown) and a memory (not shown). The test device 120 generates and communicates packetized test pattern data to the IC device 110 via the communication interface 130. In one example, the test controller 114 receives the packetized test pattern data from the communication device 116, processes the packetized test pattern data, and communicates the processed test pattern data to the test control circuitry 112. Further, the test controller 114 receives resulting data (e.g., error data) from the test control circuitry 112 and communicates the resulting data to the test device 120 via the communication device 116 and the communication interface 130. The resulting data is generated by performing one or more of boundary scan test and scan chain tests with the processed test pattern data.

Figure 2:
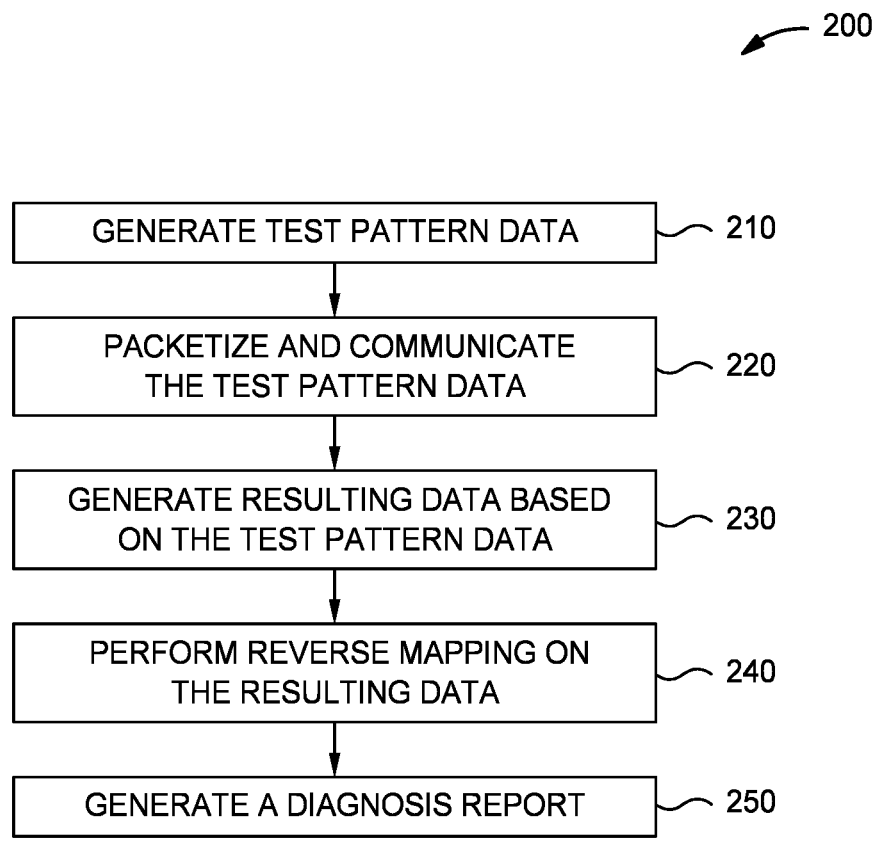
FIG. 2 illustrates a flow chart of a method for generating test data and resulting data, according to one or more examples.

FIG. 2 illustrates a method 200 for generating test pattern data and processing received resulting data, according to one or more examples. At block 210, test pattern data is generated. The test pattern data is data that may be applied to the IC device 110 to distinguish between correct circuit behavior and faulty circuit behavior caused by defects. The test pattern data is communicated in a standard test interface language (STIL) or the like. At block 220 the test pattern data is packetized and communicated to the DUT. For example, with reference to FIG. 1, the test device 120 packetizes the test pattern data and communicates the packetized test pattern data to the IC device 110. The test controller 114 receives the test pattern data via the communication device 116 and the communication interface 130. As will be described in greater detail in the following, the test controller 114 initiates a test within the test control circuitry 112 and/or core logic 118 based on the test pattern data.

At block 230, resulting data is generated based on the test pattern data. The test control circuitry 112 generates the resulting data based on the test pattern data. The resulting data is based on a boundary scan test and/or a scan chain test. In one example, the test controller 114 generates resulting data as an error map in response to performing the test. The error map includes a list of identified faults (defects). At block 240, reverse mapping is performed on the resulting data (e.g., the error map). For example, the test controller 114 performs reverse mapping on the error data to associate identified faults with different functions and/or portions of the IC device 110 to generate a pattern failure file. The pattern failure file is communicated to the test device 120 via the communication interface 130 and the communication devices 116 and 122. At block 250, diagnosis is performed on the pattern failure file to generate a diagnosis report. For example, the test device 120 performs diagnosis on the pattern failure file to generate the diagnosis report. The diagnosis report may be saved in a memory of the test device 120 and/or displayed on a display screen of the test device 120.

Figure 10:
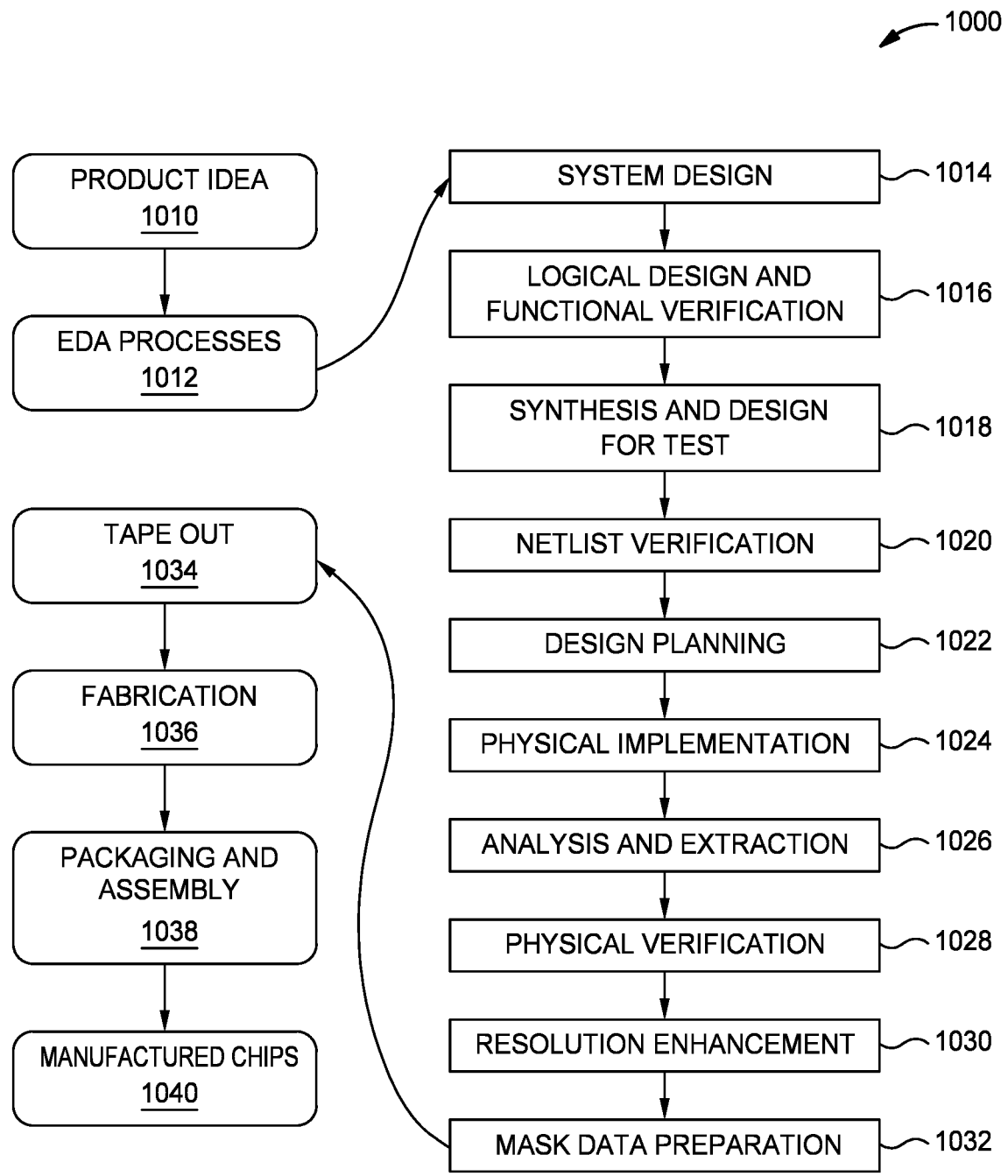
FIG. 10 depicts a flowchart of various processes used during the design and manufacture of an integrated circuit in accordance with some embodiments of the present disclosure.

In one example, the method 200 may occur after manufacturing of the IC devices (e.g., process manufactured chips 1040 of FIG. 10).

Figure 3:
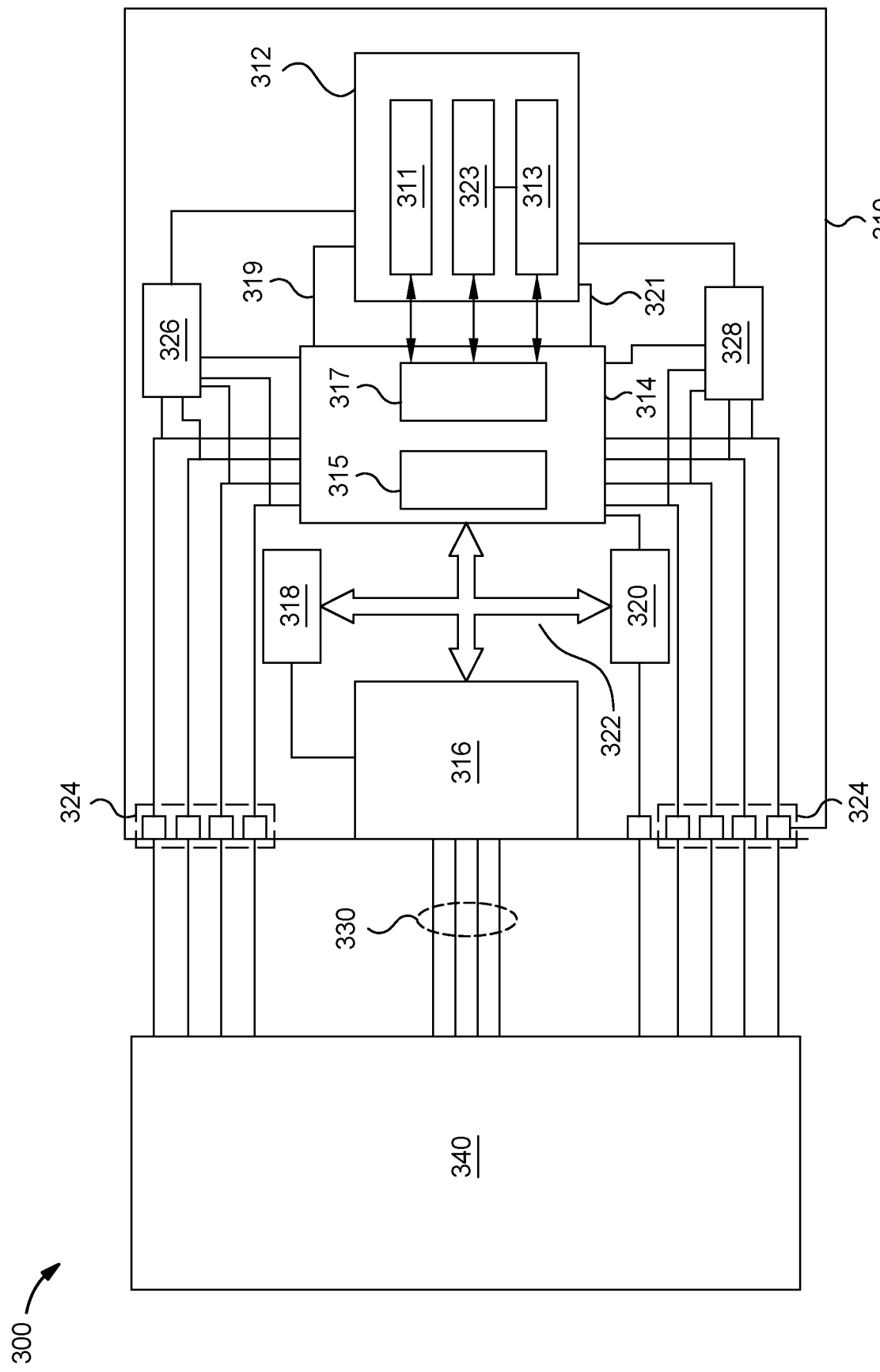
FIG. 3 illustrates a block diagram of a testing system, according to one or more examples.

FIG. 3 illustrates an example testing system 300, according to one or more examples. The testing system 300 includes IC device 310 and test device 340. The test device 340 is connected to the IC device 310 via the communication interface 330. The test device 340 communicates packetized test pattern data to the IC device 310 and receives error data from the IC device 310 via the communication interface 330.

The IC device 310 is configured similar to the IC device 110. For example, the IC device 310 includes test control circuitry 312, a test controller 314, and a communication device 316. The IC device 310 further includes core logic (not shown). The test control circuitry 312 is configured similar to that of the test control circuitry 112. The test control circuitry 312 includes scan chain circuitry 313 having inputs and outputs connected to the test controller 114 and TAP control circuitry 311.

The IC device 310 may be referred to as a manufactured IC device. For example, the elements of the IC device 310 are mounted to one or more circuit boards to form the IC device 310.

The test controller 314 is configured similar to the test controller 114. Further, the test controller 314 includes an interconnect bridge 315 and test bridge circuitry 317. The interconnect bridge 315 is an AXI bridge. For example, the interconnect bridge 315 may be an ARM AMBA AXI. In other examples, the interconnect bridge 315 is another type of point to point interconnect bridge. The interconnect bridge 315 communicates with the communication device 316, memory 318, and the processor 320 via the interconnect 322. The interconnect 322 and the interconnect bridge 315 are a similar protocol. For example, the interconnect 322 and the interconnect bridge 315 are an AXI interconnect protocol, or another type of point to point interconnect protocol.

In one or more examples, the AXI read and write data widths may be the same. For example, the AXI read and write data widths may be referred to as AXI_DATA_WIDTH and may be 32, 64 and 128 bits or more. Further, the AXI read and write data widths may be ARM AMBA AXI read and write data widths.

In an example where the width of test bridge circuitry 317 is less than the width of the test data pattern, the width of each test pattern data packet includes more than one shift data. Further, in one or examples, the test data pattern is a split packet that which is divided to drive the scan chain circuitry 313.

In one example, scan chain circuitry 313 includes the decompressor and compressor circuitry 323. In one or more examples, the decompressor and compressor circuitry 323 is external to the scan chain circuitry 313, but internal to the test control circuitry 312. In other examples the decompressor and compressor circuitry 323 is external to the test control circuitry 312. The decompressor and compressor circuitry 323 is utilized to drive the scan chains of the scan chain circuitry 313 in instances where the number of pins (e.g., scanin pins) available for driving the scan chains is less than the number of scan chains within the scan chain circuitry 313. The decompressor and compressor circuitry 323 receives test data from the test bridge circuitry 317 and processes the test data pattern to generate test data for each the scan chains of the scan chain circuitry 313. For example, the decompressor and compressor circuitry 323 generates test data for each of the scan chains of the scan chain circuitry 313 based on the decoded test data generated by the test controller 314. In one example, the test pattern data is received by the test controller 314 via the communication device 316, decoded by the test controller 314, and communicated to the decompressor and compressor circuitry 323 via the test bridge circuitry 317. The decompressor and compressor circuitry 323 generates test data for each scan chain of the scan chain circuitry 313 from the decoded test data and communicates the test data to each scan chain of the scan chain circuitry 313. In one or more examples, the decompressor and compressor circuitry 323 may be omitted and the test data is provided to the scan chain circuitry 313 directly from the test bridge circuitry 317.

In one example, packetized test pattern data is received by the test controller 314 from the test device 340 via the communication device 316 and the communication interface 330. The communication device 316 is configured similar to that of the communication device 116 of FIG. 1. Further, the communication interface 330 is configured similar to the communication interface 130 of FIG. 1 and the test device 340 is configured similar to the test device 120 of FIG. 1.

The test controller 314 communicates test data to the TAP control circuitry 311 and the scan chain circuitry 313 of the test control circuitry 312 via the test bridge circuitry 317. The test bridge circuitry 317 is connected to the TAP control circuitry 311 and the scan chain circuitry 313. In one example, the test bridge circuitry 317 is connected to the decompressor and compressor circuitry 323. In such an example, the test bridge circuitry 317 is coupled to the scan chain circuitry 313 via the decompressor and compressor circuitry 323. Further, in such an example, the test bridge circuitry 317 may or may not be directly connected to the scan chain circuitry 313. The TAP control circuitry 311 may be referred to as boundary scan circuitry. The TAP control circuitry 311 is used to test the interconnections and circuit elements within the IC device 310. In one example, the test controller 314 communicates a test enable signal 319 to the testing control circuitry 312 to initiate the testing via the TAP control circuitry 311 and the scan chain circuitry 313. Further, the test controller 314 communicates a clock signal to the testing control circuitry 312.

The processor 320 initializes and enumerates the high speed communication protocol of the communication device 316. The processor 320 initializes and enumerates the communication device 316 via the interconnect 322. In one example, the processor 320 is a Joint Test Action Group (JTAG) processor. The processor 320 receives an initialization signal and/or other control signals from the test device 340. For example, the test device 340 communicates an initialization signal to the processor 320 to initialize testing procedures (e.g., a testing mode) within the IC device 310. For example, the initialization signal initializes the test controller 314 to send test data to the testing control circuitry 312.

The IC device 310 further includes general purpose input/output (GPIO) pins 324. The GPIO pins 324 are connected to the test controller 314. One or more of the GPIO pins 324 receive control signals, test data, and/or configuration data from the test device 340. The test controller 314 receives one or more of a control signal, test data, and configuration data from the test device 340 via one or more of the GPIO pins 324. In one example, the data rate supported by the GPIO pins 324 is less than the data rate supported by the communication device 316 and the communication interface 330.

The IC device 310 additionally includes TAP bypass multiplexer (mux) 326 and scan bypass mux 328. The TAP bypass mux 326 is connected to the GPIO pins 324, the test controller 314, and the test control circuitry 312. The scan bypass mux 328 is connected to the GPIO pins 324, the test controller 314 and the test control circuitry 312. The TAP bypass mux 326 and the scan bypass mux 328 are described in greater detail with regard to FIG. 5.

Figure 4:
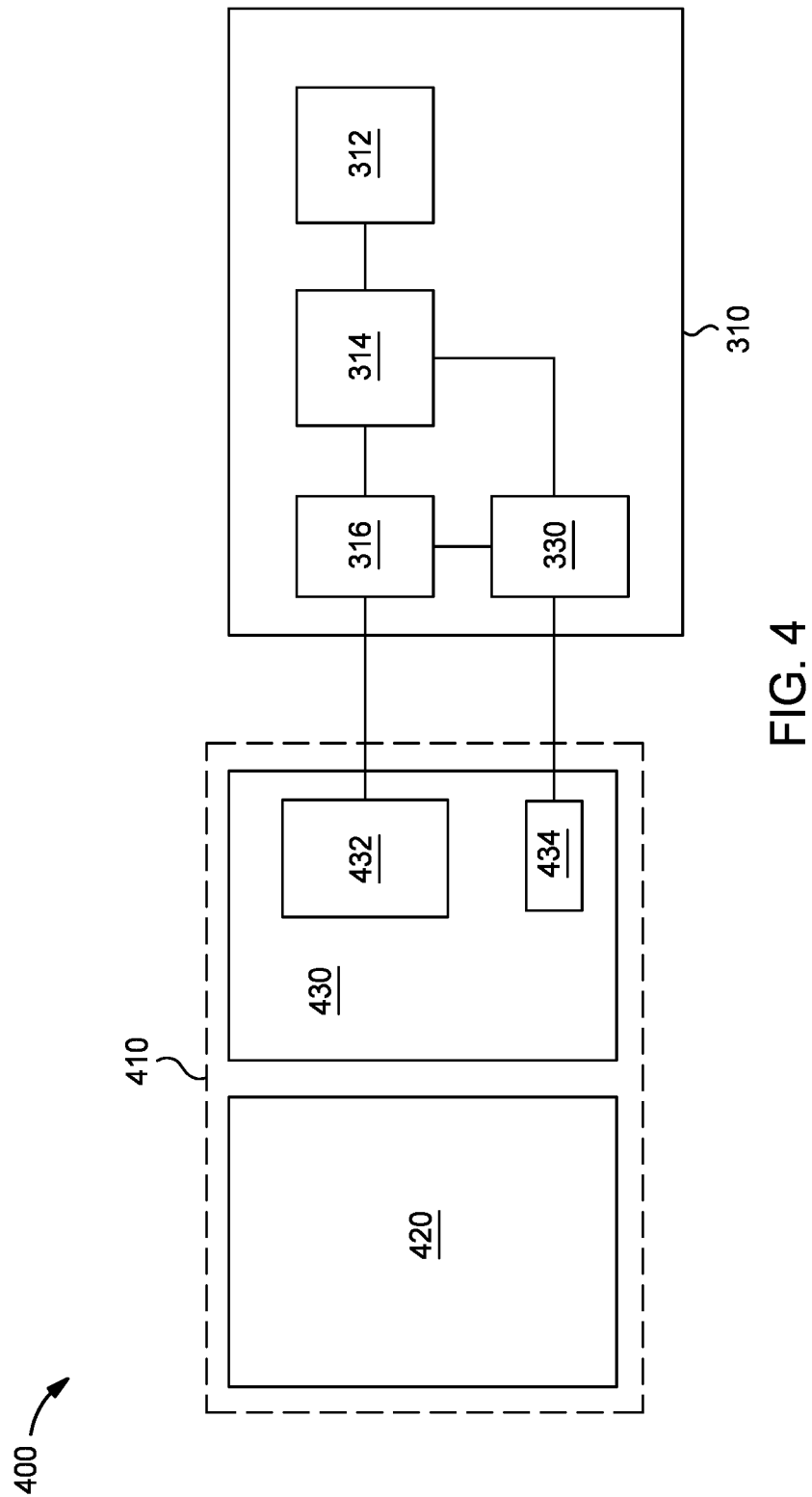
FIG. 4 illustrates a block diagram of a testing system, according to one or more examples.

FIG. 4 illustrates an example of a testing system 400, according to one or more examples. The testing system 400 includes the IC device 310 and a test device 410. Test device 410 includes a shell engine 420 and host circuitry 430. The shell engine 420 includes one or more processors (e.g., the processor device 1202 of FIG. 12) configured to execute instructions (e.g., the instructions 1226 of FIG. 12) stored in a memory (e.g., the main memory 1204 or the machine-readable medium 1224 of FIG. 12). The shell engine 420 generates packetized test data patterns and communicates the packetized test data patterns to the host circuitry 430. Further, the shell engine 420 receives error information from the host circuitry 430 and determines errors within the error information.

The host circuitry 430 includes driver circuitry, a communication device 432, and a JTAG processor 434. The driver circuitry 440 receives packetized test pattern data from the shell engine 420 and communicates the packetized test pattern data to the IC device 310 via the communication device 432. Further, the driver circuitry 440 receives error data (e.g., resulting data) from the IC device 310 via the communication device 432. The driver circuitry 440 compares the error data to the packetized test data pattern to determine failure information. The failure information is communicated to shell engine 420. The shell engine 420 processes the failure information to generate a datalog and to diagnosis any failures within the core logic of the IC device 310.

The JTAG processor 434 communicates a test initialization signal to the processor 320.

Figure 5:
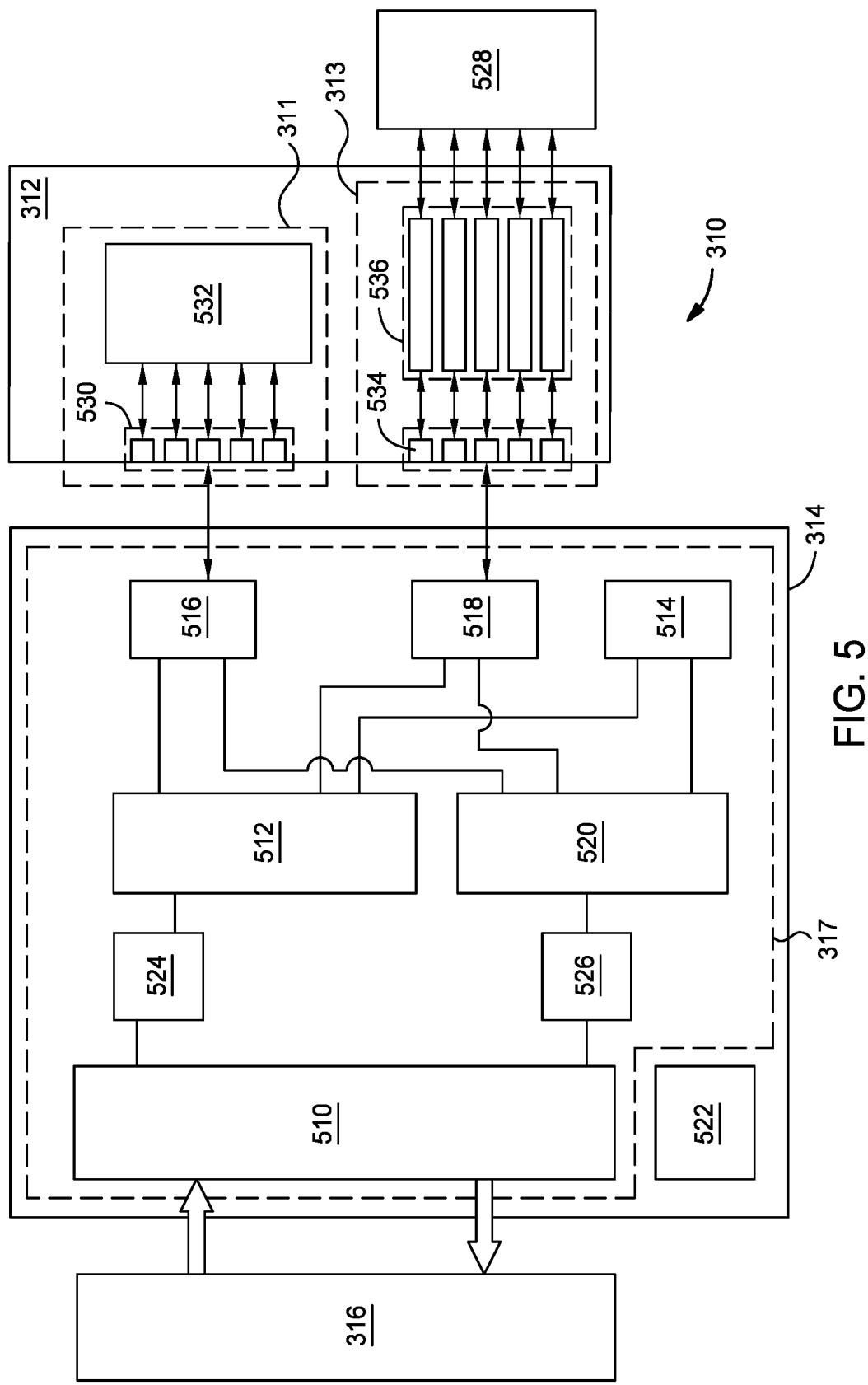
FIG. 5 illustrates a block diagram of a portion of an integrated circuit device, according to one or more examples.

FIG. 5 illustrates example architecture of a portion of the test controller 314, according to one or more examples. The architecture of the test controller 314 includes slave bridge circuitry 510, packet decoder circuitry 512, control circuitry 514, TAP bridge circuitry 516, scan bridge circuitry 518, packet encoder circuitry 520, and debug circuitry 522. The test controller 314 further includes first-in-first-out (FIFO) circuitry 524 and FIFO 526. In other examples, the FIFO 524 and/or the FIFO 526 may be other types of buffers or memory devices.

The slave bridge circuitry 510 receives packetized test pattern data and stores the test pattern data within the FIFO 524. The FIFO 524 is connected to the packet decoder circuitry 512. The FIFO 524 communicates the packetized test pattern data to the packet decoder circuitry 512 on a first input first out basis. The packet decoder circuitry 512 decodes the test pattern data to generate decoded test data. The packet decoder circuitry 512 communicates decoded test data to the control circuitry 514, TAP bridge circuitry 516, and/or the scan bridge circuitry 518.

The packet encoder circuitry 520 receives resulting data from the control circuitry 514, TAP bridge circuitry 516, and/or the scan bridge circuitry 518. The packet encoder circuitry 520 packetizes the resulting data and communicate the packetized error data to the FIFO 526. The FIFO 526 communicates the packetized resulting data to the slave bridge interface circuitry 610 to be communicated from the test controller 314 to the test device (e.g., the test device 340 of FIG. 3) via a communication device (e.g., the communication device 316 of FIG. 3) and a communication interface (e.g., the communication interface 330 of FIG. 3).

The control circuitry 514 is connected to the packet decoder circuitry 512 and packet encoder circuitry 520. In one example, the control circuitry 514 receives the decoded test data initializes the settings of the test controller 314 based on the decoded test data. The decoded test data includes configuration data, and the control circuitry 514 adjusts one or more settings of the test controller 314 based on the configuration data. Further, the control circuitry 514 communicates with the packet decoder circuitry 512 to control the packet decoder circuitry 512 to decode the received test data patterns. Further, the control circuitry 514 communicates with the packet encoder circuitry 520 to control the packet encoder circuitry 520 to encode outgoing resulting data.

The TAP bridge circuitry 516 is connected to the TAP pins 530 within the test control circuitry 312. The packet decoder circuitry 512 communicates the decoded test data to the TAP bridge circuitry 516 and the TAP bridge circuitry 516 communicates the decoded test data to one or more TAP pins the test control circuitry 312. In one example, the packet decoder circuitry 512 identifies test data from the received test data pattern to be communicated to TAP pins 530. In an example, the test data that is to be sent to the TAP pins 530 is associated with a boundary scan test. The TAP pins 530 communicate the test data to boundary scan circuitry 532 within the test control circuitry 312 received from the TAP bridge circuitry 516 and communicates error data received from the boundary scan circuitry 532 to the TAP bridge circuitry 516. A boundary scan test may be utilized to verify board-level connection issues and other manufacturing issues. The identified issues may be communicated as part of the resulting data output from the boundary scan circuitry 532. In one or more examples, the TAP bridge circuitry 516 includes addressable registers which receive and store the boundary scan data and the boundary error data.

The scan bridge circuitry 518 is connected to the scan chain pins 534. The packet decoder circuitry 512 identifies scan test data within the test pattern data to be communicated to the scan bridge circuitry 518. The scan test data corresponds to test data that is utilized to scan test patterns into internal circuits within the core logic 528. The scan bridge circuitry 518 communicates the scan test data to the scan chains 536 via the scan chain pins 534 and the scan chains 536 communicates the scan test data to the core logic 528. The core logic 528 communicates scan resulting data to the scan chain 536, which communicates the scan resulting data to the scan bridge circuitry 518 via the scan chain pins 534. The scan resulting data corresponds to errors within circuit elements of the core logic 528. In one example, the scan resulting data is indicative of one or more circuit elements of the core logic 528 having an incorrect logic level as compared to the scan test data. In one or more examples, the scan bridge circuitry 518 includes addressable registers which receive and store the scan test data and the scan resulting data.

The debug circuitry 522 provides write/read capability to the internal registers of the test controller 314 via a JTAG processor (e.g., the processor 320 of FIG. 3). In one example, the debug circuitry 522 receives test initialization signal from the JTAG processor and configures the internal registers of the test controller 314 for read/write to initialize the test controller 314 for test.

In one example, the slave bridge circuitry 510, the FIFO 524, the packet decoder circuitry 512, the control circuitry 514, the packet encoder circuitry 520, and the FIFO 526 operate in a first clock domain. The TAP bridge circuitry 516 operates in the first clock domain and a second clock domain different from the first clock domain. The scan bridge circuitry 518 operates in the first clock domain and a third clock domain different than the first and third clock domains. The debug circuitry 522 operates in the first clock domain and a fourth clock domain different from the first, second, and third clock domains.

In various examples, the number of scan chains 536 is greater than the width of the slave bridge circuitry 510. For example, the number of scan chains 536 is 512 and the width of slave bridge circuitry 510 is 32, 64, 128, or 256 channels. In one example, received packets of test pattern data are accumulated before driving the scan chains 536 with shift data. The slave bridge circuitry 510 is an AXI interface. A continuous set of packets of test pattern data may be sent to the slave bridge circuitry 510 to generate a complete test data pattern. The packets of the test pattern data are accumulated within the packet decoder circuitry 512. In one example, using split packets of test pattern data improves the latency of packet handling by the packet decoder circuitry 512.

In one or more examples, the test controller 314 employs loopback features that are used for debug processes. The test controller 314 may employ three different loopbacks. A first loopback (e.g., a slave loopback) includes the slave bridge circuitry 510, the FIFO 524, the packet decoder circuitry 512, and the FIFO 526. The first loopback may be used to validate the functionality of slave bridge circuitry 510 and the corresponding system integration. For example, test data is input via the slave bridge circuitry 510, passed through each of the FIFO 524, the packet decoder circuitry 512, and the FIFO 526 to generate resulting data at the slave bridge circuitry 510. The test data is compared with the resulting data to determine the functionality of the corresponding elements. If the test data differs from the resulting data, faults may be indicated. A second loopback (e.g., scan loopback), the FIFO 524, the packet decoder circuitry 512, the scan bridge circuitry 518, the packet encoder circuitry 520, and the FIFO 526. The second loopback may be used to validate the functionality of scan bridge circuitry 518. For example, test data is input to the scan bridge circuitry 518 via the FIFO 524 and the packet decoder circuitry 512, and resulting data is output from the scan bridge circuitry 518 to the packet encoder circuitry 520, and the FIFO 526 to generate resulting data. The test data is compared with the resulting data to validate the signals generated by the scan bridge circuitry 518. If the test data differs from the resulting data, faults may be indicated within the scan bridge circuitry 518.

A third loopback (e.g., TAP loopback), the FIFO 524, the packet decoder circuitry 512, the TAP bridge circuitry 516, the packet encoder circuitry 520, and the FIFO 526. The third loopback may be used to validate the functionality of TAP bridge circuitry 516. For example, test data is input to the TAP bridge circuitry 516 via the FIFO 524 and the packet decoder circuitry 512, and resulting data is output from the TAP bridge circuitry 516 to the packet encoder circuitry 520, and the FIFO 526 to generate resulting data. The test data is compared with the resulting data to validate the signals generated by the TAP bridge circuitry 516. If the test data differs from the resulting data, faults may be indicated within the TAP bridge circuitry 516.

Figure 6:
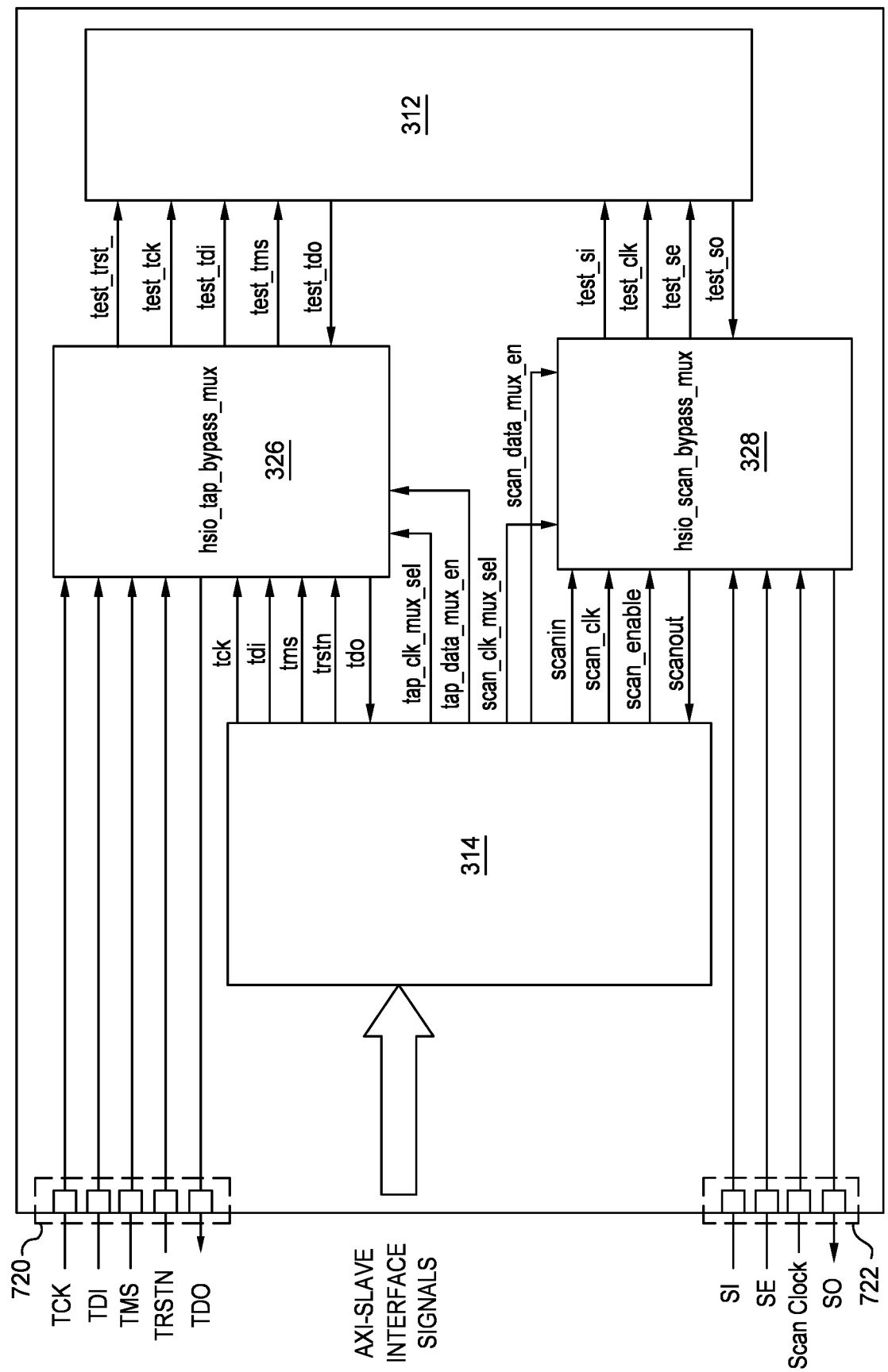
FIG. 6 illustrates a block diagram of a portion of an integrated circuit device, according to one or more examples.

FIG. 6 illustrates a portion of the IC device 310, according to one or more examples. The test controller 314 is connected to the testing control circuitry 312 via the TAP bypass mux 326 and the scan bypass mux 328.

The TAP bypass mux 326 is electrically connected to GPIO pins 720 and the scan bypass mux 328 is electrically connected to GPIO pins 722. The GPIO pins 720 and 722 are configured similar to the GPIO pins 324 of FIG. 3. The TAP bypass mux 326 receives the clock signal TCK, the data in signal TDI, management signal TMS, reset signal TRSTN, and outputs the data out signal TDO via the GPIO pins 720. Further, the TAP bypass mux 326 receives signals TCK, TDI, TMS, and TRSTN from the test controller 314 and outputs TDO to the test controller 314. The test controller 314 additionally communicates the selection signal tap_clk_mux_sel and the enable signal tap_data_mux_en to the TAP bypass much 326.

The TAP bypass mux 326 communicates a reset signal test_trst, clock signal test_tck, data signal test_tdi, and management signal test_tms and receives the data output signal test_tdo from the test control circuitry 312. The signal test_trst corresponds to one of the signal TRSTN received from the GPIO pins 720 and the signal TRSTN received from the test controller 314. The signal test_tck corresponds to one of the signal TCK received from the GPIO pins 720 and the signal tck_received from the test controller 314. The signal test_tdi corresponds to one of the signal TDI received from the GPIO pins 720 and the signal tdi received from the test controller 314. The signal test_tms corresponds to one of the signal TMS received from the GPIO pins 720 and the signal tms received from the test controller 314.

The TAP bypass mux 326 connects the test control circuitry 312 with the GPIO pins 722 based on the tap_clk_mux_sel signal having a first value and the TAP bypass mux 326 connects the test controller 314 with the testing control circuitry 312 based on the tap_clk_mux_sel signal having a second value. The TAP bypass mux 326 outputs the signals TCK, TDI, TMS, and TRSTN as the signals test_trst, test_tck, test_tdi, and test_tms, respectively, based on the tap_clk_mux_sel signal having a first value. Further, the TAP bypass mux 326 outputs the signals TCK, TDI, TMS, and TRSTN as the signals outputs the signal test_trst, test_tck, test_tdi, and test_tms, respectively, based on the tap_clk_mux_sel signal having a second value. The first value is indicative of the test controller 314 not being enabled and corresponding test operations not being enabled, and the second value is indicative of the test controller 314 being enabled and corresponding test operations being enabled. Further, based on the tap_clk_mux_sel signal having the first value, the TAP bypass mux 326 outputs the output signal test_tdo to the GPIO pins 720 as the output signal TDO. Based on the tap_clk_mux_sel signal having the second value, the TAP bypass mux 326 outputs the output signal test_tdo to the test controller 314 as the output signal tdo. In one example, when the test controller 314 is enabled, and the testing mode is enabled, the tap_data_mux_en signal enables the TAP bypass mux 326.

The scan bypass mux 328 receives a scan in signal SI, a scan enable signal SE, and a scan clock signal Scan Clock, and outputs a scan out signal SO to the GPIO pins 722. Further, the scan bypass mux 328 receives the scan enable signal scan_enable, the scan in signal scanin, and scan clock signal scan_clk, and outputs the output scan signal scanout to the test controller 314. The test controller 314 further outputs the select signal scan_clk_mux_sel and the enable signal scan_data_mux_en to the scan bypass mux 328.

The scan bypass mux 328 outputs the test input signal test_si, the test clock signal test_clk, and the test scan enable signal test_se to the test control circuitry 312 and receives the test scan output signal test_so from the test control circuitry 312.

In one example, the signal test_si corresponds to one of the signal SI and signal scanin, the signal test_clk corresponds to one of the signal scan clock and the signal scan_clk, and the signal test_se corresponds to one of the signal SE and the signal scan_enable.

The scan bypass mux 328 connects the test control circuitry 312 with the GPIO pins 722 based on the tap_clk_mux_sel signal having a first value scan bypass mux 328 connects the test controller 314 with the testing control circuitry 312 based on the tap_clk_mux_sel signal having a second value. The scan bypass mux 328 outputs the signal SI as the signal test_si, the signal SE as the signal test_se, and the signal Scan Clock as the signal test_clk based on the scan_clk_mux_sel signal having a first value. The scan bypass mux 328 outputs the signal scanin signal as the signal test_si, the signal scan_clk as the signal test_clk, and the signal scan_enable as the signal test_se based on the scan_clk_mux_sel signal having a second value. Further, based on the scan_clk_mux_sel signal having the first value, the scan bypass mux 328 outputs the signal test_so to the GPIO pins 722 as the signal SO, and based on the scan_clk_mux_sel signal having the second value, the scan bypass mux 328 outputs the signal test_so to the test controller 314 as the signal scanout. The first value is indicative of the test controller 314 not being enabled and corresponding test operations not being enabled, and the second value is indicative of the test controller 314 being enabled and corresponding test operations being enabled. In one example, when the test controller 314 is enabled, and the testing mode is enabled, the scan_data_mux_en signal enables the scan bypass mux 328.

Figure 7:
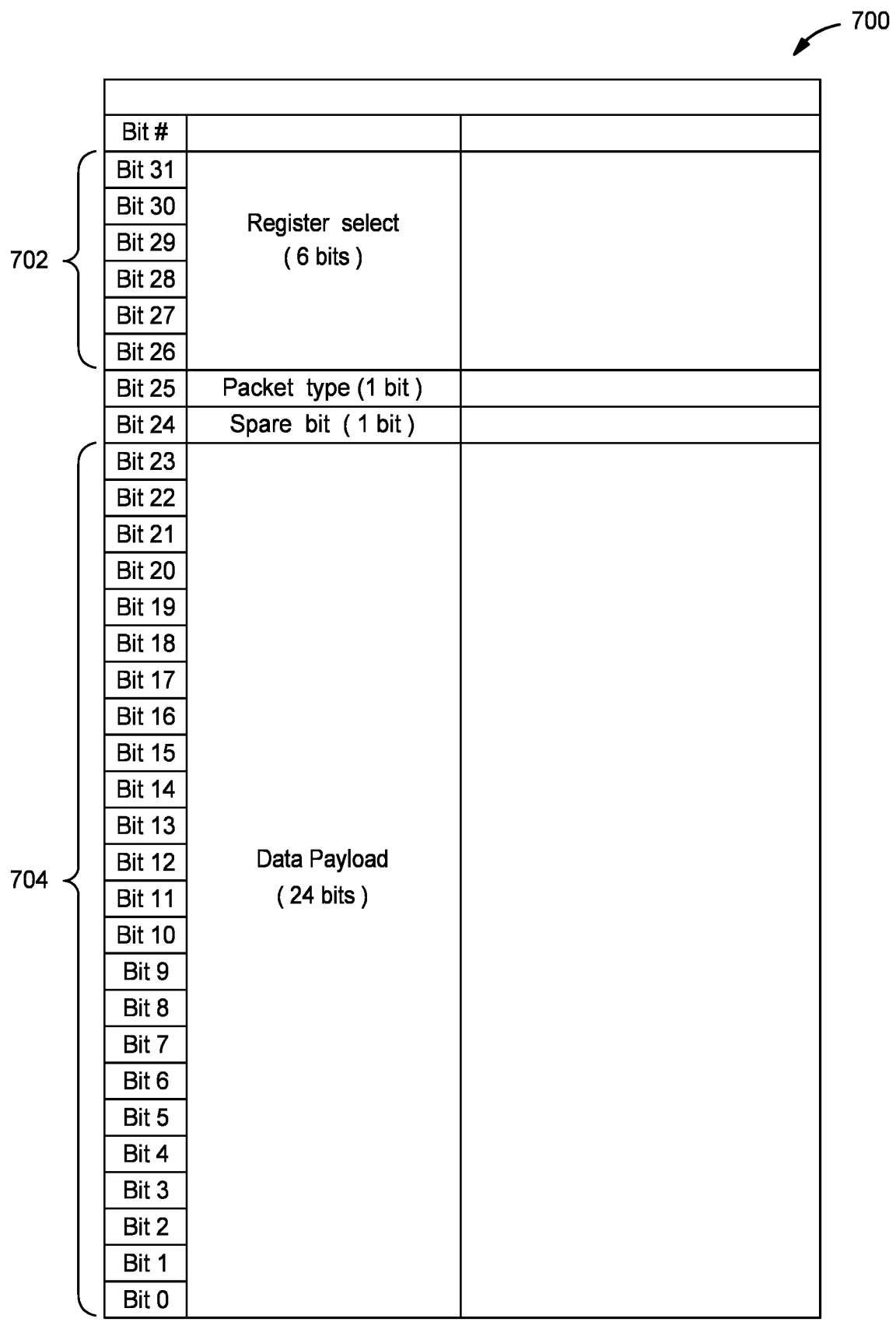
FIG. 7 illustrates a test data packet, according to one or more examples.

FIG. 7 illustrates a packet structure 700, according to one or more examples. Packetized test data is communicated from a test device (e.g., the test device 120 of FIG. 1 or the test device 340 of FIG. 3) to an IC device (e.g., the IC device 110 of FIG. 1 or the IC device 310 of FIG. 3). The packet structure 700 includes configuration data for a test controller (e.g., the test controller 114 of FIG. 1 or the test controller 314 of FIG. 3) and test data (e.g., boundary scan test data and scan chain test data) for the IC device. The packet structure 700 is supported by a test controller (e.g., the test controller 114 of FIG. 1 or the test controller 314 of FIG. 3).

In one example, the packet structure 700 is a standalone packet utilized to configure control registers of the test controller with a single packet. For example, the packet structure 700 has register address, data, and other information in a single consolidated packet. The packet structure 700 may be used to configure the control registers of the test controller. For example, the bits 702 of the packet structure 700 include configuration data for the test controller. In one example, bits 702 include 6 bits of the packet structure 700. In one example, a test controller (e.g., the test controller 114 of FIG. 1 or the test controller 314 of FIG. 3) processes packetized test data communicated via the packet structure to identify the values of the bits 702 to identify the configuration data for the test controller. The configuration data configures the test controller to function in a test mode and perform test operations. In one example, the configuration data is used by the test controller to perform a boundary scan test and/or a scan chain test. The configuration data is used by the test controller to identify which test or tests (e.g., boundary scan test and scan chain test) to perform. The configuration data is used by the test controller to configure one or more registers of the test controller.

The packet structure 700 further includes bits 704. The bits 704 include the data payload including the test data. The bits 704 includes 24 bits. In one example, a test controller (e.g., the test controller 114 of FIG. 1 or the test controller 314 of FIG. 3) processes packetized test data communicated via the packet structure 700 to identify the values of the bits 704 to identity the test data.

The packet structure 700 includes 32 bits. However, in other examples, the packet structure is less than or more than 32 bits.

Figure 8:
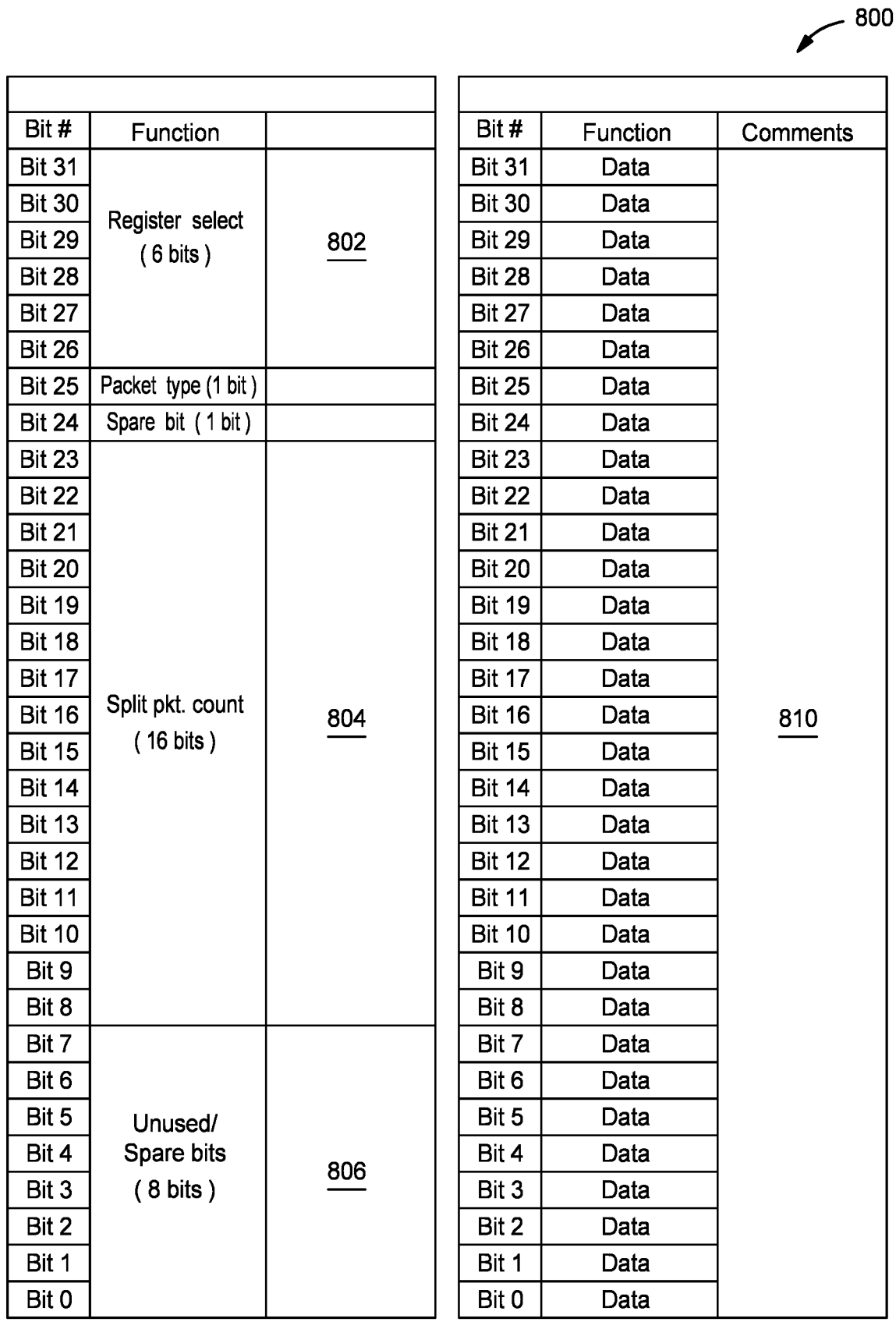
FIG. 8 illustrates test data packets, according to one or more examples.

FIG. 8 illustrates a packet structure 800, according to one or more examples. The packet structure 800 is configured similar to that of the packet structure 700. For example, the packet structure 800 includes bits 802 that are used by a test controller (e.g., the test controller 114 of FIG. 1 or the test controller 314 of FIG. 3) to configure the test controller as is described with regard to bits 702 of FIG. 7. The packet structure 800 is a split packet sequence. For example, the packet structure 800 includes two packets of N bits. N is 32. In other examples, N is greater than or less than 32.

The packet structure 800 includes bits 804. The bits 804 identify the number of the test data packets that are included in the split package sequence. The bits 806 are unused. In one example, the bits 802, 804, and 806 may be referred to the control (or header) bits. The bits 810 are the test data bits. The bits 810 are configured similar to the bits 704 if FIG. 7. In one example, the packet structure 800 is a split packet including an initial control packet (e.g., bits 802, 804, and 806) followed by multiple data payloads packets (e.g., bits 810). In one example, the packet structure 800 is utilized to send continuous streams of data over multiple clock cycles without incurring additional latency between consecutive data payloads. As compared to the packet structure 700, the packet structure 800 may be used to load larger control registers and larger data payloads.

Figure 9:
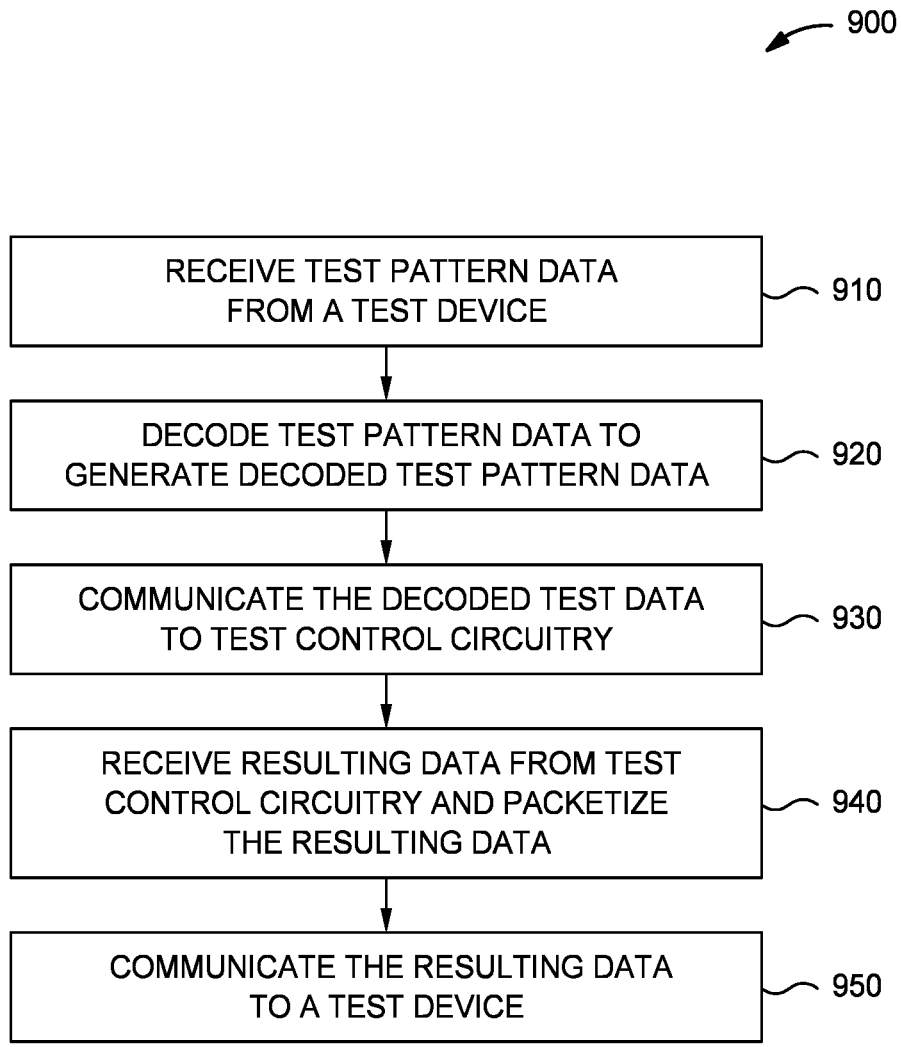
FIG. 9 illustrates a flow chart of method for generating resulting data from test data, according to one or more examples.

FIG. 9 illustrates a flowchart of a method 900 for receiving and processing test data, according to one or more examples. At block 910 of FIG. 9, test pattern data is received from a test device. For example, with reference to FIG. 3, the IC device 310 receives the test pattern data from the test device 340. In one example, the test pattern data is packetized test pattern data. In such an example, the test device 340 generates the packetized test pattern data and communicates the packetized test pattern data via a communication device (e.g., the communication device 122 of FIG. 1) via the communication interface 330. The packetized test pattern data is received by the communication device 316 of the IC device 310. The communication device of the test device 340, the communication interface 330, and the communication device 316 form a high speed communication system. For example, a high speed communication system is a communication system that is able to communication the packetized test pattern data at more than 1 Mbps or 1 Gbps. The communication device 316 communicates the packetized test pattern data to the test controller 314 via the interconnection 322. For example, the interconnect bridge 315 of the test controller 314 receives the packetized test pattern data from the communication device 316 via the interconnection 322.

At block 920, the test pattern data is decoded. With reference to FIG. 3, the test controller 314 decodes the test pattern data (e.g., the packetized test pattern data) to generate decoded test data. In one example, with reference to FIG. 5, the slave bridge circuitry 510 receives the test pattern data and stores the test pattern data in the FIFO 524. The packet decoder circuitry 512 receives the test pattern data from the FIFO 524 and decodes the test pattern data to generate decoded test data. Decoding the test pattern data identifies configuration data (e.g., a first portion of the test pattern data) for the test controller 314 and test data. The test data may be boundary scan test data or scan chain test data.

At block 930, decoded test data is communicated to the test control circuitry. With reference to FIG. 3, the decoded test data is communicated from the test controller 314 to the test control circuitry 312. The test bridge circuitry 317 of the test controller 314 communicates the test data to the TAP control circuitry 311 and/or the scan chain circuitry 313 of the test control circuitry 312. In one example, the test bridge circuitry 317 communicates test data to the scan chain circuitry 313 via the decompressor and compressor circuitry 323. With reference to FIG. 5, the TAP bridge circuitry 516 outputs test data (e.g., test data associated with a boundary scan test) to the TAP pins 530 and the boundary scan circuitry 532 of the test control circuitry 312. Further, the scan bridge circuitry 518 outputs test data (e.g., test data associated with scan test data) to the scan chain pins 534 and the scan chains 536 of the test control circuitry 312. Further, the scan test data is output to the core logic 528. Further, configuration data is output to the control circuitry 514 to configure the registers of the test controller 314.

At block 940, resulting data is received from the test control circuitry. With reference to FIG. 3, resulting data is received by the test controller 314 from the test control circuitry 312. The resulting data is error data and includes error information based on the corresponding tests performed. In one example, the test bridge circuitry 317 receives resulting data from the TAP control circuitry 311 and/or the scan chain circuitry 313. With reference to FIG. 5, the resulting data corresponding to a boundary scan test is output from the boundary scan circuitry 532 to the TAP bridge circuitry 516 via the TAP pins 530. The TAP bridge circuitry 516 communicates the resulting data to the packet encoder circuitry 520. The packet encoder circuitry 520 encodes (e.g., packetizes) the resulting data and outputs the encoded resulting data to the FIFO 526.

Additionally, or alternatively, resulting data corresponding to a scan chain test is output from the scan chains 536 to the scan bridge circuitry 518 via the scan chain pins 534. The resulting data is received from the core logic 528. The scan bridge circuitry 518 communicates the resulting data to the packet encoder circuitry 520. The packet encoder circuitry 520 encodes (e.g., packetizes) the resulting data and outputs the encoded resulting data to the FIFO 526.

At block 950, the resulting data is communicated to the test device. With reference to FIG. 3, the test controller 314 communicates the resulting data to the test device 340 via the communication device 316 and the communication interface 330. The resulting data is packetized resulting data. The resulting data is communicated from the interconnect bridge 315 to the communication interface 330 via the interconnect 322.

The test device 340 processes the resulting data to determine to detect errors. For example, the test device 340 compares the resulting data to the test data to determine whether or not errors are present within the resulting data. Further, the test device 340 identifies the type of error (e.g., boundary scan error or scan chain error) and the location of the error within the IC device 310.

FIG. 10 illustrates an example set of processes 1000 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1010 with information supplied by a designer, information which is transformed to create an article of manufacture that uses a set of EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed to produce the finished integrated circuit 1040.

Specifications for a circuit or electronic structure may range from low-level transistor material layouts to high-level description languages. A high-level of example may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower level adds more useful detail into the design description, for example, more details for the modules that include the description. The lower levels can be generated by a computer, derived from a design library, or created by another design automation process. An example of a specification language for specifying more detailed descriptions is SPICE, which is used for detailed descriptions of circuits with many analog components. Descriptions at each level are enabled for use by the corresponding tools of that layer (e.g., a formal verification tool). A design process may use a sequence depicted in FIG. 10. The processes described by be enabled by EDA products (or tools).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1026, the circuit function is verified at the layout level, which permits refinement of the layout design. During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the 'tape-out' data is used to produce lithography masks that are used to produce finished integrated circuits.

A storage subsystem of a computer system (such as computer system 1100 of FIG. 11) may be used to store the programs and data structures that are used by some or all of the EDA products described herein, and products used for development of cells for the library and for physical and logical design that use the library.

Figure 11:
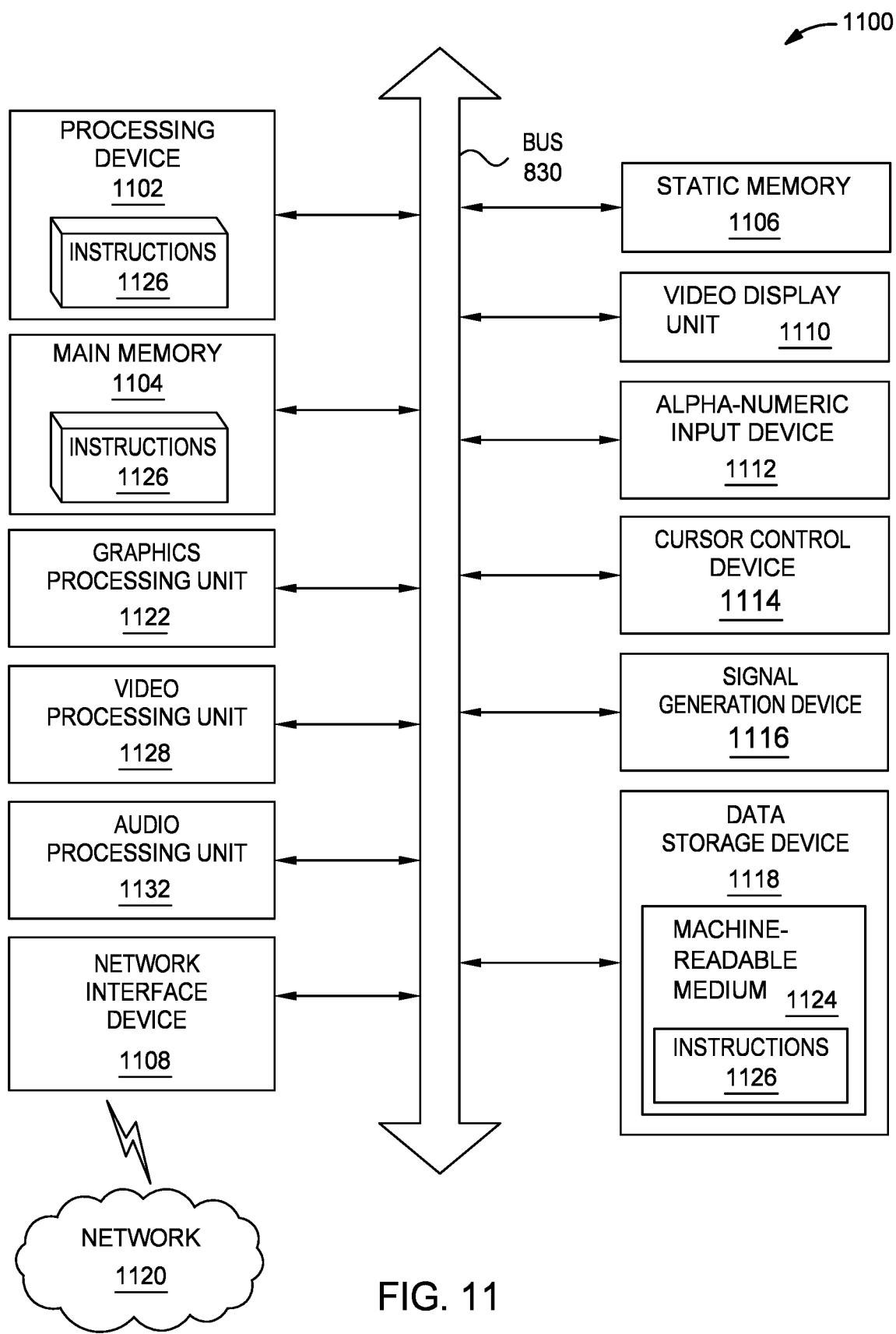
FIG. 11 depicts a diagram of an example computer system in which embodiments of the present disclosure may operate.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An integrated circuit (IC) device comprising:
   test control circuitry comprising test access port (TAP) circuitry and scan chain circuitry; and
   a test controller electrically coupled with the test control circuitry, the test controller comprising:
      packet decoder circuitry configured to decode packetized test pattern data to identify configuration data for the test controller and test data for the test control circuitry;
      TAP bridge circuitry connected to the packet decoder circuitry and configured to receive the test data and communicate the test data to the TAP circuitry of the test control circuitry; and
      scan bridge circuitry connected to the packet decoder circuitry and configured to receive the test data and communicate the test data to the scan chain circuitry of the test control circuitry, wherein the test controller is configured to packetize resulting data received from the test control circuitry, wherein the resulting data corresponds to errors identified by a test performed based on the test data.

2. The IC device of claim 1 further comprising:
a communication device configured to:
receive the packetized test pattern data from a testing device; and
communicate the packetized test pattern data to the test controller.

3. The IC device of claim 1, wherein the test data corresponds to one of the TAP circuitry and the scan chain circuitry.

4. The IC device of claim 1, wherein the test controller further comprises:
packet encoder circuitry connected to the TAP bridge circuitry and the scan bridge circuitry, the packet encoder circuitry is configured to:
receive resulting data from the TAP bridge circuitry and the scan bridge circuitry;
packetize the resulting data; and
output the packetized resulting data to a testing device.

5. The IC device of claim 1, wherein the packet decoder circuitry is further configured to accumulate packetized test pattern data before decoding the packetized test pattern data.

6. A method comprising:
receive packetized test pattern data from a test device;
decode, via packet decoder circuitry of a test controller of an integrated circuit (IC) device, the packetized test pattern data to identify configuration data for the test controller and test data;
communicate, via test access port (TAP) bridge circuitry of the test controller, the test data to TAP circuitry of test control circuitry;
communicate, via scan bridge circuitry of the test controller, the test data to scan chain circuitry of the test control circuitry;
packetize resulting data received from the test control circuitry, wherein the resulting data corresponds to errors identified by a test performed within the IC device based on the test data; and
output the packetized resulting data from the IC device to the test device.

7. The method of claim 6, wherein the packetized test pattern data is received via a communication device of the IC device, and the method further comprises communicating the packetized test pattern data from the communication device to the test controller.

8. The method of claim 6, wherein the test data corresponds to one of the TAP circuitry and the scan chain circuitry.

9. The method of claim 8 further comprising accumulating packetized test pattern data before decoding the packetized test pattern data.

10. The method of claim 6 further comprising:
receiving, via packet encoder circuitry of the test controller, the resulting data from the TAP bridge circuitry and the scan bridge circuitry, wherein the packet encoder circuitry is configured to packetize the resulting data.

11. A test controller of an integrated circuit (IC) device comprising:
interconnect bridge circuitry configured to receive packetized test pattern data; and
test bridge circuitry comprising:
packet decoder circuitry configured to decode the packetized test pattern data to identify configuration data and test data for test control circuitry of the IC device;
test access port (TAP) bridge circuitry configured to receive the test data from the packet decoder circuitry and communicate the test data to TAP circuitry of the test control circuitry;
scan bridge circuitry configured to receive the test data and communicate the test data to scan chain circuitry of the test control circuitry; and
packetize resulting data received from the test control circuitry, wherein the resulting data corresponds to errors identified by a test performed based on the test data.

12. The test controller of claim 11, wherein the packetized test pattern data is received by a communication device from a test device, and wherein the communication device is connected the interconnect bridge circuitry and is configured to communicate the packetized test pattern data to the test bridge circuitry via the interconnect bridge circuitry.

13. The test controller of claim 11, wherein the test data corresponds to one of the TAP circuitry and the scan chain circuitry.

14. The test controller of claim 11, wherein the test bridge circuitry further comprises:
packet encoder circuitry connected to the TAP bridge circuitry and the scan bridge circuitry, the packet encoder circuitry is configured to:
receive resulting data from the TAP bridge circuitry and the scan bridge circuitry;
packetize the resulting data; and
output the packetized resulting data to a test device.

* * * * *